United States Patent
Rao et al.

(10) Patent No.: US 10,630,249 B2
(45) Date of Patent: Apr. 21, 2020

(54) LOW POWER MODE OF OPERATION FOR MM-WAVE RADAR

(71) Applicant: Texas Instruments Incorporated, Dallas, TX (US)

(72) Inventors: Sandeep Rao, Bangalore (IN); Brian Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 263 days.

(21) Appl. No.: 15/669,229

(22) Filed: Aug. 4, 2017

(65) Prior Publication Data
US 2019/0044485 A1 Feb. 7, 2019

(51) Int. Cl.
| | |
|---|---|
| H03F 3/217 | (2006.01) |
| G01S 3/14 | (2006.01) |
| G01S 13/34 | (2006.01) |
| G01S 7/35 | (2006.01) |
| G01S 13/93 | (2020.01) |
| G01S 13/42 | (2006.01) |
| H03B 5/12 | (2006.01) |
| H01Q 1/22 | (2006.01) |

(Continued)

(52) U.S. Cl.
CPC .............. *H03F 3/2171* (2013.01); *G01S 3/14* (2013.01); *G01S 7/35* (2013.01); *G01S 7/354* (2013.01); *G01S 13/343* (2013.01); *G01S 13/42* (2013.01); *G01S 13/931* (2013.01); *H01Q 1/2283* (2013.01); *H01Q 3/26* (2013.01); *H03B 5/1212* (2013.01); *H03B 5/1228* (2013.01); *H03F 3/245* (2013.01); *H03F 3/45188* (2013.01); *G01S 2007/356* (2013.01)

(58) Field of Classification Search
None
See application file for complete search history.

(56) References Cited

U.S. PATENT DOCUMENTS 4,983,979 A * 1/1991 McKenzie ............ G01S 13/284
342/131
5,309,160 A * 5/1994 Powell .................. G01S 13/282
342/128

(Continued)

FOREIGN PATENT DOCUMENTS

EP 1314049 B1 7/2010

OTHER PUBLICATIONS

Bert Van Den Broek et al. Automatic Detection of Hostile Behavior. Proc, SPIE 7480, Unmanned/Unattended Sensors and Sensor Networks VI, 74800R (Sep. 24, 2009); doi: 10.1117/12.829468; https// doi.org/10.1117/12.829468, /Chapter 6.2.2.

(Continued)

*Primary Examiner* — Bernarr E Gregory
(74) *Attorney, Agent, or Firm* — Brian D. Graham; Charles A. Brill; Frank D. Cimino

(57) ABSTRACT

Disclosed examples include a radar system that operates in a first mode and a second mode. In the first mode, the system detects the presence of an object within a threshold range. In response to detection of the presence of the object, the system transitions to the second mode, and the system generates range data, velocity data, and angle data of the object in the second mode. When the object is no longer detected within the threshold range, the system transitions back to the first mode.

16 Claims, 3 Drawing Sheets

(51) Int. Cl.
  *H01Q 3/26* (2006.01)
  *H03F 3/24* (2006.01)
  *H03F 3/45* (2006.01)
  *G01S 13/931* (2020.01)
  *G01S 13/00* (2006.01)

(56) References Cited

U.S. PATENT DOCUMENTS

| | | | | |
|---|---|---|---|---|
| 5,987,395 | A * | 11/1999 | Donges | G01S 13/08 |
| | | | | 702/149 |
| 8,405,541 | B2 * | 3/2013 | Lee | G01S 13/34 |
| | | | | 342/118 |
| 8,472,884 | B2 | 6/2013 | Ginsburg et al. | |
| 8,513,607 | B2 | 8/2013 | Ramaswamy et al. | |
| 8,674,824 | B1 * | 3/2014 | Straw | G01S 15/87 |
| | | | | 340/539.1 |
| 8,786,338 | B2 | 7/2014 | Rentala et al. | |
| 8,902,103 | B2 * | 12/2014 | Kim | G01S 13/345 |
| | | | | 342/118 |
| 8,994,585 | B2 | 3/2015 | Ginsburg et al. | |
| 2004/0196173 | A1 * | 10/2004 | Kuroda | G01S 7/35 |
| | | | | 342/82 |
| 2008/0186224 | A1 | 8/2008 | Ichiyanagi et al. | |
| 2009/0201194 | A1 * | 8/2009 | Winkler | G01S 7/35 |
| | | | | 342/146 |
| 2012/0313895 | A1 | 12/2012 | Haroun et al. | |
| 2015/0084806 | A1 * | 3/2015 | Rohling | G01S 13/345 |
| | | | | 342/109 |
| 2015/0185316 | A1 | 6/2015 | Rao et al. | |
| 2015/0285904 | A1 | 10/2015 | Rao | |
| 2015/0378016 | A1 * | 12/2015 | Schoor | G01S 13/345 |
| | | | | 342/21 |
| 2016/0018511 | A1 | 1/2016 | Nayyar et al. | |
| 2016/0061942 | A1 | 3/2016 | Rao et al. | |
| 2016/0116570 | A1 | 4/2016 | Ramasubramanian et al. | |
| 2016/0146931 | A1 | 5/2016 | Rao et al. | |
| 2016/0146933 | A1 | 5/2016 | Rao et al. | |
| 2016/0187462 | A1 | 6/2016 | Altus et al. | |
| 2016/0187464 | A1 | 6/2016 | Ginsburg | |
| 2016/0252607 | A1 | 9/2016 | Saboo et al. | |
| 2016/0291130 | A1 | 10/2016 | Ginsburg et al. | |
| 2016/0299215 | A1 | 10/2016 | Dandu et al. | |
| 2016/0334503 | A1 | 11/2016 | Ginsburg et al. | |
| 2017/0023663 | A1 | 1/2017 | Subburaj et al. | |
| 2017/0054449 | A1 | 2/2017 | Mani et al. | |
| 2017/0074974 | A1 | 3/2017 | Rao et al. | |
| 2017/0090014 | A1 | 3/2017 | Subbaraj et al. | |
| 2017/0090015 | A1 | 3/2017 | Breen et al. | |
| 2017/0102457 | A1 | 4/2017 | Li et al. | |
| 2017/0115377 | A1 | 4/2017 | Giannini et al. | |
| 2017/0139036 | A1 | 5/2017 | Nayyar et al. | |

OTHER PUBLICATIONS

International Search Report dated Nov. 8, 2018.
Doerry et al., "Apodization of Spurs in Radar Receivers Using Multi-Channel Processing", Sandia National Laboratories, Printed Mar. 2014, 26 pages.
"AFE5401-Q1 Quad-Channel, Analog Front-End for Automotive Radar Baseband Receiver", Texas Instruments, AFE5401-Q1, SBAS619A—Mar. 2014—Revised Jun. 2017, 79 pages.

* cited by examiner

LOW POWER MODE OF OPERATION FOR MM-WAVE RADAR

BACKGROUND

Radar systems are used in a variety of applications, including aircraft navigation, security and defense applications, as well as automotive applications for driver assistive functions, object detection, etc. Frequency modulated continuous wave (FMCW) radar systems continuously radiate power from one or more transmit antennas to create frequency modulated signals referred to as "chirps." An array of receive antennas receive scattered or reflected signals from detected objects within the range of the transmit antenna or antennas. Radar systems employ different chirp signals at different times in order to cover multiple radar ranges, such as long and short ranges for object detection and other uses. Certain radar systems mix the receive signal with the transmitted chirp signal to create an intermediate frequency (IF) signal to facilitate detection of objects at different ranges (distances). A first fast Fourier transform (FFT) can be performed on the received data to separate the objects in a range domain, and a second FFT can be performed for relative velocity or speed separation to yield multidimensional data indicating the range and relative velocity of detectable reflectors or objects. In essence, the distance can be estimated by estimating the frequency of the received IF signal which in turn is related to the round-trip delay and hence the range of a reflector or object. Velocity is estimated by observing the same object across multiple chirps and looking at the phase rotation or movement of the frequency difference. A third FFT can be performed across data from multiple receive chains to separate angle information. One problem with current systems is large power consumption, particularly for battery powered applications.

SUMMARY

Radar systems and methods are presented using an approach with a first mode and a second mode. In the first mode (sometimes referred to herein as the "detect only mode"), the system detects the presence of an object, and upon detection of the object, transitions to the second mode (sometimes referred to herein as the "regular mode"). In certain examples, the system determines the position, velocity and angle of the object in the second mode. A radar system is disclosed, including a transmitter circuit that provides chirp signals to a transmit antenna, as well as a receiver circuit and an analog-to-digital converter to generate received data based on signals from receive antennas. The system includes a processor. The processor controls the transmitter circuit to deliver a plurality of first mode transmit frames in the first mode. The individual first mode transmit frames have a first mode frame duration and include first mode chirp signals. The first mode transmit frames are temporally spaced from one another by a first mode sleep time interval. The processor generates first mode range data based on receive data frames corresponding to the first mode transmit frames, and transitions to the second mode in response to detection of an object within a threshold range based on the range data. In the second mode, the processor controls the transmitter circuit to deliver a plurality of second mode transmit frames which are reflected off objects and then are received at the receive antenna array. The individual second mode transmit frames have a second mode frame duration and include second mode chirp signals. The second mode transmit frames are temporally spaced from one another by a second mode sleep time interval. In some implementations, the first mode sleep time interval is longer than the second mode sleep time interval. In certain examples, the first mode frame duration is shorter than the second mode frame duration.

In some implementations, the system transitions from the second mode to the first mode in response to the object no longer being within the threshold range. In some examples, the system transitions to the first mode when the object is no longer within the threshold range for an integer number M or more consecutive frames, where M is greater than 1. In some examples, the processor performs a first fast Fourier transform (FFT) on the receive data associated with the first mode chirp signals to generate first mode range data. In some examples, the processor performs a first FFT on the receive data associated with the second mode chirp signals to generate second mode range data, and/or performs a second FFT on the second mode range data to generate second mode velocity data. In some implementations, the receiver circuit includes an amplifier with an input coupled with the receive antenna array to receive the receive signals, and an output to provide an amplified receive signal according to an adjustable amplifier gain. The processor sets the adjustable amplifier gain to a first gain in the first mode to cause the amplifier to operate with a first noise figure, and sets the adjustable amplifier gain to a lower second gain in the second mode to cause the amplifier to operate with a second noise figure, where the second noise figure is higher than the first noise figure. In certain examples, the amplifier linearity is better in the second mode than in the first mode.

A method is provided for processing radar signals in a radar system, including performing a first fast Fourier transform (FFT) on receive data in a first mode to generate first mode range data of an object, and to determine that the object is present within a threshold range. The method includes transitioning to a second mode in response to determining that the object is present within the threshold range. The method further includes performing a first FFT on receive data of the second mode to generate second mode range data of the object, and performing a second FFT on the second mode range data to generate second mode velocity data of the object. In some implementations, the method includes transitioning from the second mode to the first mode when the object is not present within the threshold range. In some examples, the method includes transitioning to the first mode when the object is no longer within the threshold range for an integer number M or more consecutive frames, where M is greater than 1. In some examples, the method includes delivering a plurality of first mode transmit frames to the transmit antenna array in the first mode, where the individual first mode transmit frames include first mode chirp signals and have a first mode frame duration, where the first mode transmit frames are temporally spaced from one another by a first mode sleep time interval. The method also includes generating first mode range data based on receive data frames corresponding to the first mode transmit frames. In some examples, the method includes delivering a plurality of second mode transmit frames (via reflections off objects) to the receive antenna array in the second mode. The individual second mode transmit frames have a second mode frame duration and include second mode chirp signals. The second mode transmit frames are temporally spaced from one another by a second mode sleep time interval. In some implementations, the first mode sleep time interval is longer than the second mode sleep time interval. In some implementations, the first mode frame duration is shorter than the second mode frame duration.

DETAILED DESCRIPTION

Figure 1:
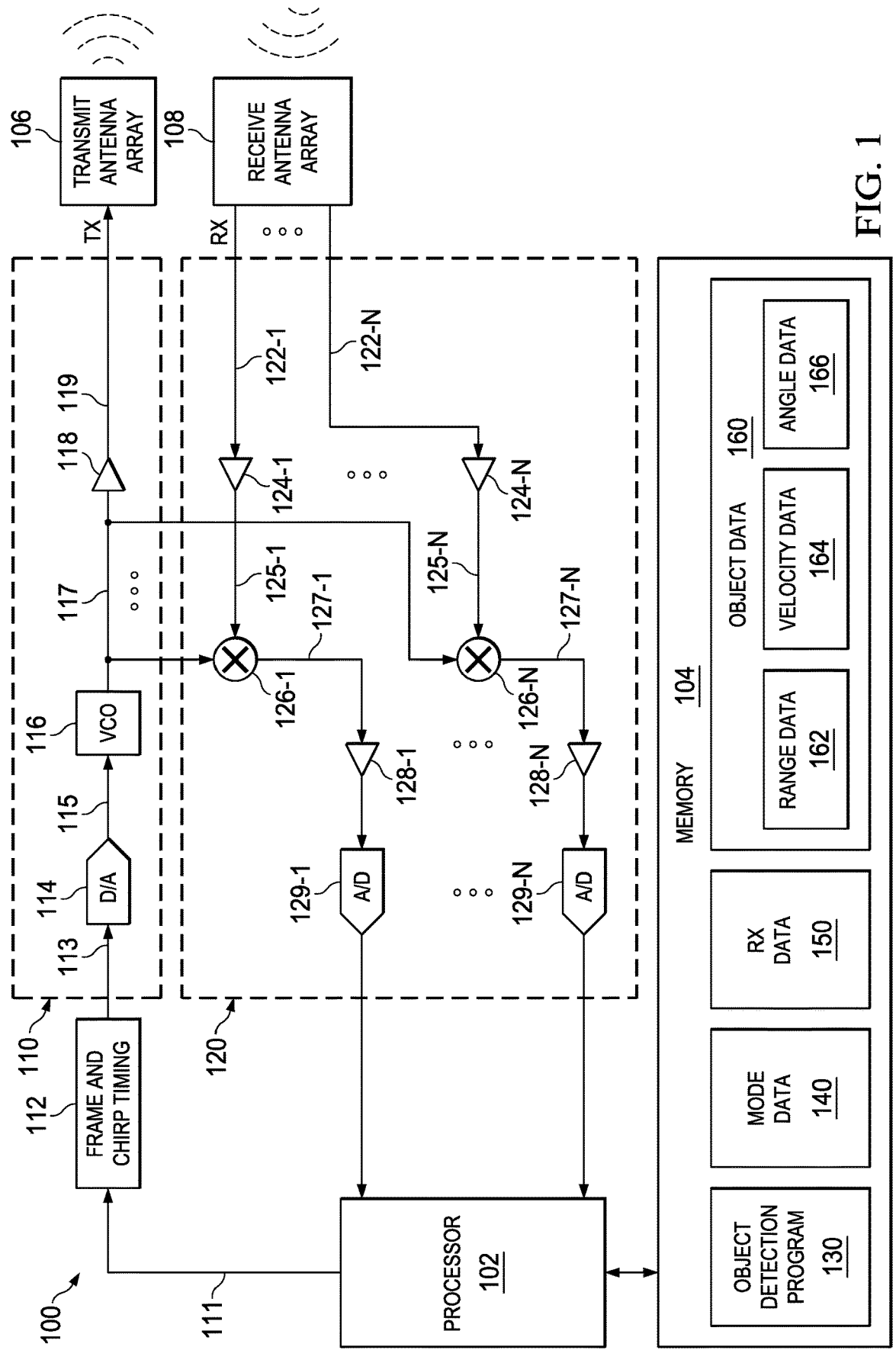
FIG. 1 is a schematic diagram of a radar system.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "coupled" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a frequency modulated continuous wave (FMCW) radar system 100 with a processor 102, an electronic memory 104, a transmit antenna array 106 and a receive antenna array 108. In various implementations, the transmit antenna array 106 includes one or more transmit antennas. In this regard, although FIG. 1 illustrates a single transmit circuit chain. In certain example, the system include multiple transmit antennas 106 and separate transmit circuit chains, where the chirp generation and voltage controlled oscillator (VCO) is shared between multiple transmit circuit chains. The system 100 includes a transmitter circuit 110 configured to selectively provide frequency modulated chirp signals from a frame and chirp timing circuit 112 to the transmit antenna array 106 for transmission. The system 100 also include a receiver circuit 120 with inputs 122-1, . . . 122-N operatively coupled to the receive antenna array 108 in order to receive an integer number N receive signals (RX) from a corresponding set of N receive antennas of the array 108, where N is greater than or equal to 1. The receiver circuit 120 includes one or more analog-to-digital converter circuits 129-1, . . . 129-N which provide a corresponding set of N samples to the processor 102.

The frame and chirp timing circuit 112 in one example is a separate circuit as shown. In one implementation, the circuit 112 is implemented by the processor 102. The frame and chirp timing circuit 112 has an output 113 which provides a corresponding baseband signal as a series of digital values to a digital-to-analog converter (D/A or DAC) 114. The digital values define a suitable modulating waveform, such as a sinewave, a saw tooth waveform, a triangular waveform, a rectangular waveform, a staircase waveform, etc. The chirp timing circuit 112 in one example provides a control signal to the VCO 116 that determines the nature of the frequency variation, e.g., saw-tooth, triangular, etc. Also, depending on the design, the DAC can be omitted, for example, using a digitally controlled oscillator instead of an analog VCO. In certain examples, a digital baseband signal is provided through a DAC that is used to impart a phase shift on the DCO output. In certain implementations, moreover, different DACs are used to impart different phase shifts to the signals going into different transmit antennas of the array 106 (e.g., for beam-forming). Certain implementations also impart small frequency shifts, different for each transmit antenna channel, using a similar DAC and mixer based mechanism (not shown). For improved accuracy, certain implementations use a feedback loop around the voltage controlled oscillator (VCO) to form a Phase Locked Loop (PLL) structure.

The D/A converter 114 includes an output 115 that provides an analog signal to the VCO 116. The output signal from the D/A converter 114 is a modulating signal that corresponds to the digital values provided by the frame and chirp timing circuit 112 (e.g., saw tooth, sinusoidal, triangular, rectangular, staircase, etc.). In certain examples, a D/A is included in each TX chain. In certain examples, a pair of D/A converters is used, one for I and one for Q, for a complex baseband, to induce phase and/or frequency shifts on the VCO/DCO output. The VCO 116 includes an output 117 that provides a high frequency output signal with a modulated frequency determined by the modulating voltage amplitude of the D/A output signal. Any suitable waveforms can be used, such as having a signal bandwidth from 10 s of MHz to several GHz or more. An amplifier 118 receives the VCO output signal and provides a selected one of M distinct chirp signals TX to the transmit antenna or antennas 106. In certain examples, the amplifier path is separated for each transmit circuit signal chain, and mixers can be used to provide phase/frequency shifting specific to each chain.

The receiver circuit 120 includes N chains, each having an input 122-1, . . . 122-N connected to provide the corresponding receive signal RX from one of the receive antennas 108 to a corresponding low noise amplifier (LNA) 124-1, . . . 124-N. In certain examples, the LNAs 124 have a single bit or multiple bit gain adjustment feature implemented by a control register. In one example, the transmit antenna array 106 includes 16 transmit antennas, and the receive antenna array 108 includes 16 receive antennas. Transmit and/or receive arrays 106, 108 can individually include any suitable number of antenna elements, for example two transmit and four receive antennas in another non-limiting example. In certain implementations, the antenna arrays could be physical arrays or logically realized synthetic aperture arrays (Synthetic Aperture Radar or SAR) realized using multiple radar chips working together. Amplifier outputs 125-1, . . . , 125-N provide amplified high frequency signals to corresponding mixers 126-1, . . . , 126-N. The VCO output 117 also provides an input signal to the mixers 126-1, . . . 126-N. The mixers 126-1, . . . 126-N mix the transmitted signal with the received signal to down convert the receive signals to provide corresponding intermediate frequency (IF) or baseband signals at outputs 127-1, . . . 127-N. In certain examples, the mixers 126 generate both the in-phase (I) and quadrature (Q) components of the IF signal. In one example, the I component is generated by mixing the incoming signal with $\cos(2\pi \int_{-\infty}^{t} f_{LO}(\tau)d\tau)$ and the Q component is generated by mixing the incoming signal with $\sin(2\pi \int_{-\infty}^{t} f_{LO}(\tau)d\tau)$, where t and $\tau$ represent time in seconds, and $f_{LO}(\tau)$ is the instantaneous frequency of the transmitter VCO 116 at time $\tau$. The VGA amplifiers 128-1, . . . 128-N amplify the IF signals and provide amplified IF signals to the A/D converters 129-1, . . . 129-N. An intermediate frequency bandpass filter (not shown) can be included between the mixer output and the amplifier 128 in each receive channel. In certain examples, the amplifiers 128 are variable gain amplifiers (VGAs) to amplify the IF signals.

The processor 102 in one example is configured to adjust any or all of the gains of the LNAs 124-1, . . . 124N, and any or all of the VGAs 128-1, . . . 128-N. The processor 102 in one example changes a control register to adjust a bias of amplifier(s) 124 and/or 128 or to switch in different loads of the amplifier(s). In some implementations, amplifiers 124 have two settings for a high gain and a low gain according to a single control register bit. In other implementations, the amplifier(s) have more than two gain settings (e.g., a variable gain with multiple steps controlled by programming multiple bits of a control register). Other techniques can be used in further embodiments to adjust the amplifier gain to a first value in the first mode and a different value in the second mode. When the gain increases, the NF improves (i.e., a lower NF) and the linearity degrades. Alternatively, when adjustable amplifier gain decreases, the NF degrades (i.e., rises) and the linearity improves.

The processor 102 executes instructions of an object detection program 130 stored in the memory 104 in order to provide object range, velocity (Doppler) and angle determination processing with respect to the radar receive signals RX from the receive antenna array 108. The processor 102 controls the chirp signal generation. The processor 102 in one example provides a digital front end (DFE) processing to perform decimation filtering on the digital IF signals to reduce the data transfer rate, and may perform other signal processing functions such as removal of offsets from the digital IF signals, interference monitoring on the digital IF signals, etc. In certain embodiments, a separate DFE circuit can be provided (not shown) to receive the IF signals from the A/D converters 129 to perform front-end processing, with a high-speed interface to transfer the decimated digital IF signals to the processor 102.

In one implementation, the transmitter circuit 110 operates in the 77 GHz region and produces a frequency modulated continuous wave (FMCW) signal. Frequency modulated continuous wave radar (FMCW), also referred to as continuous-wave frequency-modulated (CWFM) radar, is capable of determining distance, and signal processing by the processor 100 facilitates identification of detected object velocity and angle. A transmit signal TX of a known stable frequency continuous wave varies up and down in frequency over a fixed period of time by a modulating signal provided by the circuits 112, 114 and 116. The frequency difference between the receive signal RX and the transmit signal TX increases with the signal delay to and from a detected object or reflector, and is therefore proportional to the distance between the radar system 100 and the object. The reflected signals or echoes from a target or object are then mixed with the transmitted signal via the mixers 126 to produce the intermediate frequency beat signal which can be evaluated to determine the distance of the target after demodulation. In operation for one example, linear frequency chirp signals are transmitted and reflected signals are received. The receiver channel circuits down-convert the receive signals RX using the mixers 126 according to the transmitted chirp signals from the VCO 116. After converting the IF signals into the digital domain, the processor 102 may perform fast Fourier transforms (FFTs) and tracking algorithms may be applied in order to detect objects in terms of distance, velocity, and angular position. The processor 102 receives a stream of data from the receiver circuit 120 and performs chirp generation and control of the transmitter circuit 110 via the frame and chirp timing circuit 112. The processor 102 may perform signal processing for object detection and tracking, and may communicate with other systems in a vehicle or other host system via a network interface (not shown).

The VCO 116 generates a linear frequency ramp called a chirp (e.g., from 77 GHz to 81 GHz) with a Slope S. The transmitted signal is reflected off from an object and is received at the RX antenna (after a round trip delay of $\tau$). The received signal is mixed with the chirp to create an intermediate frequency (IF) signal. The frequency of the IF signal depends on the delay between the TX signal and the RX signal and is given by $S\tau$ (and hence this frequency is directly proportional to the range of the object from the radar). The IF signal is digitized and then an FFT (sometimes referred to as a "range FFT") is performed. The location peaks in this FFT correspond to range of the respective objects.

The processor 102 in one example executes the object detection program instructions 130 in the memory 104 to operate on the RX data 150 to compute or determine object data 160, which is stored in the memory 104. The object data 160 in this example includes range data 162, velocity (Doppler) data 164, and angle data 166. The processor 102 implements first and second operating modes as described further hereinafter, and stores mode data 140 in the memory 104. In one example, the mode data 140 includes a bit or register indicating whether the processor 102 is operating in a first mode (e.g., 201 in FIG. 2 below) or a second mode (e.g., 210 in FIG. 2). In certain examples, the mode data 140 includes one or more parameters, predetermined and/or adjustable, to indicate various timing control parameters for operation in the first and second modes. For example, the mode data 140 can include specifications to control the slope and frequency range of the individual chirp signals, as well as a sleep time specifying a time between frames that include multiple chirp signals as described further below.

The processor 102 in one example determines range data 162 and velocity data 164 using receive data 150 from one or more receive antennas 108. In certain examples, a plurality of receive antennas are provided in the array 108 and the processor determines angle data based on receive data from two or more receive antennas.

The processor 102 can be any suitable digital logic circuit, programmable or pre-programmed, such as an ASIC, microprocessor, microcontroller, DSP, FPGA, etc. that operates to execute program instructions stored in the electronic memory 104 to implement the features and functions described herein as well as other associated tasks to implement a radar system 100. In certain examples, moreover, the memory circuit 104 can be included within the processor circuit 102. In certain examples, the memory 102 constitutes a non-transitory computer-readable storage medium that stores computer-executable instructions that, when executed by the processor 102, perform the various features and functions detailed herein. In operation, the processor 102 executes the program instructions 130 to generate the data 160 using fast Fourier transform (FFT) operations and windowing techniques.

Figure 2:
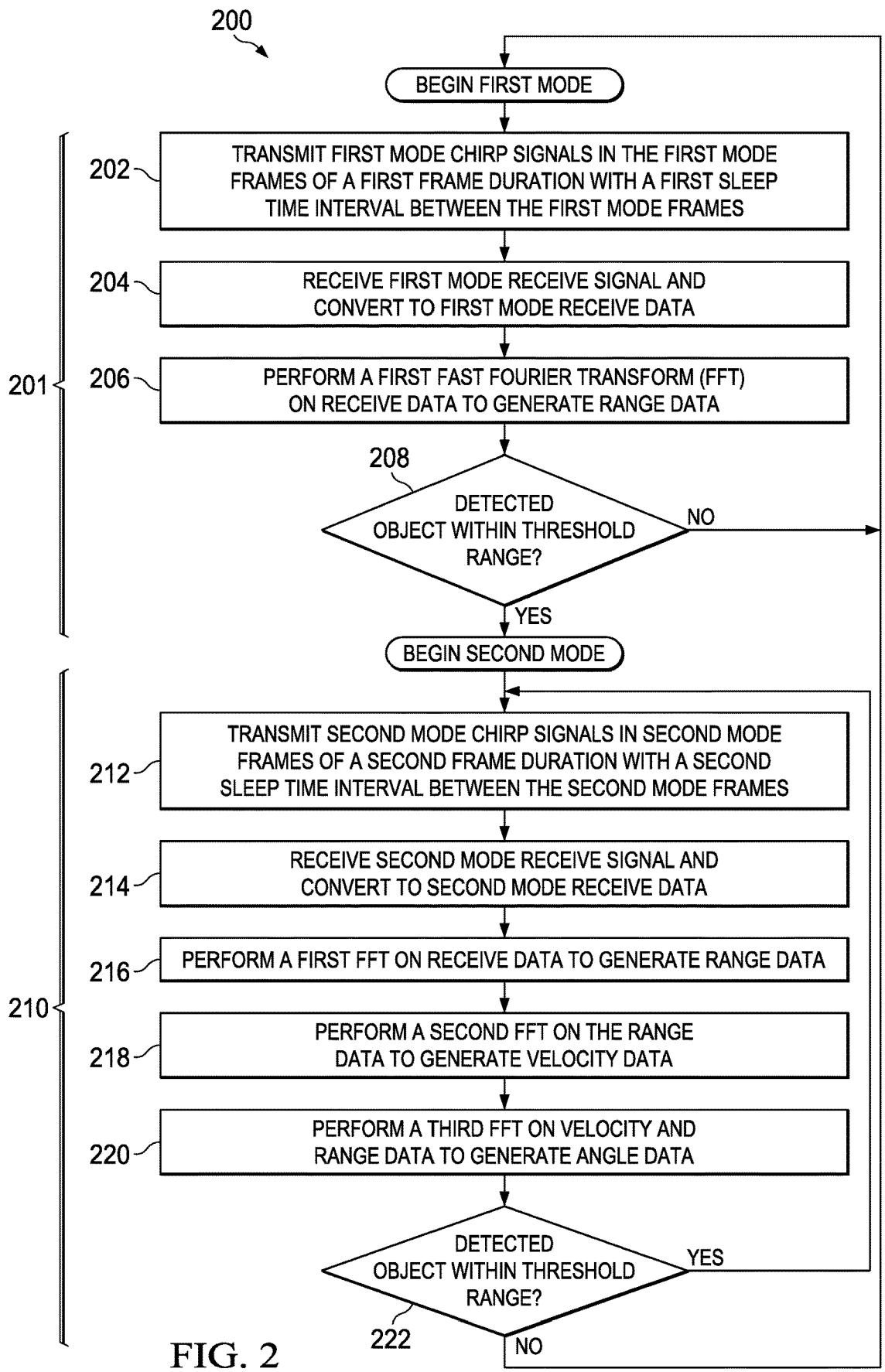
FIG. 2 is a flow diagram of a method for processing radar signals in a radar system.

FIG. 2 illustrates a method 200 for processing radar signals. FIG. 2 shows a non-limiting example flow that can be implemented by the processor 102 in the system 100 of FIG. 1, and other examples can include different variations. The method 200 implements a first operating mode 201 and a second operating mode 210. In the example of FIG. 2, the processor 102 modifies one or both of the frame duration and/or the sleep time intervals between successive frames in the first and second modes 201 and 210. In some implementations, the processor 102 selectively changes the amplifier gain settings for the LNAs 124 and/or the VGAs 128 for different gain settings in the modes 201 and 210. For example, the processor 102 in one example sets the adjustable amplifier gain to a first gain in the first mode 202 to cause the amplifier 124 to operate with a first noise figure (NF). In the second mode, the processor 102 sets the adjustable amplifier gain to a lower second gain to cause the amplifier 124 to operate with a higher second noise figure. In certain examples, the linearity of the amplifier in the second mode is better than the linearity of the amplifier in the first mode.

In addition, the illustrated example selectively switches between the modes based on detection of one or more objects within a threshold range. A variety of different mode switching criterion can be used by the processor 102 in other implementations. In the first mode at 202, the processor 102 causes the transmit antenna array 106 to transmit first mode chirp signals in first mode frames with a first mode sleep time intervals between the frames. At 204, the receive antenna array 108 receives scattered or reflected signals from detected objects within the range of the transmit antenna or antennas, and the received or reflected signals are converted to received data with the A/D converters 129-1, . . . 129-N. At 206, the processor 102 performs a first Fast Fourier transform (FFT) on the receive data of the first mode to generate range data. In certain implementations using multiple receive antennas, a first FFT is performed at 206 for each of the receive data corresponding to each receive antennas. Additionally, in some examples, the results of the first FFT is then non-coherently accumulated across antennas to create non-coherently accumulated range data. Non coherent accumulation involves accumulating the absolute value (i.e., magnitude) of the corresponding first FFT values across receive antennas. In the illustrated example, the processor 102 refrains from performing a second or subsequent FFTs in the first mode, for example, to conserve power consumed by the processor 102 in performing for the computations. This implementation can be used, for example, where further information (e.g., velocity data and/or angle data) is not needed in order to determine whether operation in the second mode is desired. In other possible implementations, the processor can perform further processing operations, including without limitation second or further FFTs in the first mode.

At 208 in the illustrated example, the processor 102 determines if an object is present within a threshold range based on the range data generated at 206. In certain implementations, the processor 102 determines the presence of an object and its range by identifying samples in the non-coherently accumulated range-data which are above a certain threshold value. The processor 102 determines the range of corresponding objects from the sample index of the identified samples. If an object is not detected within the threshold range (NO at 208), the method returns to operation in the first mode 201 at 202 until an object is detected within the threshold range. If an object is detected within the threshold range (YES at 208), the method 200 proceeds to the second mode 210.

Figure 3:
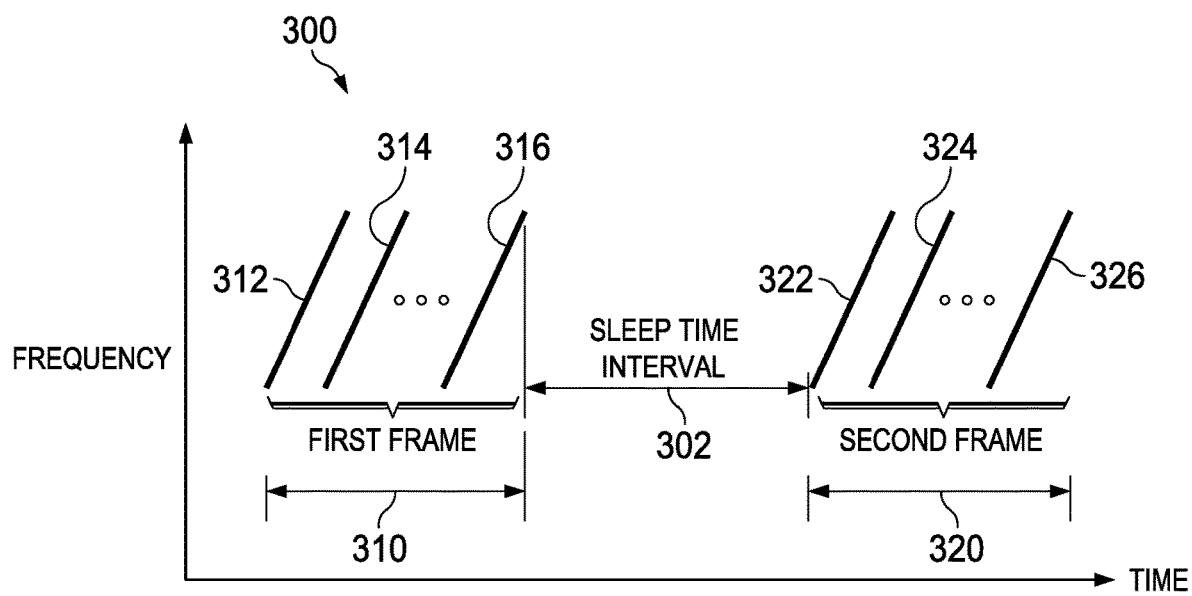
FIG. 3 is a graph showing example transmit frames with chirp signals separated by a first mode sleep time interval in a first operating mode of the radar system of FIG. 1.
Figure 4:
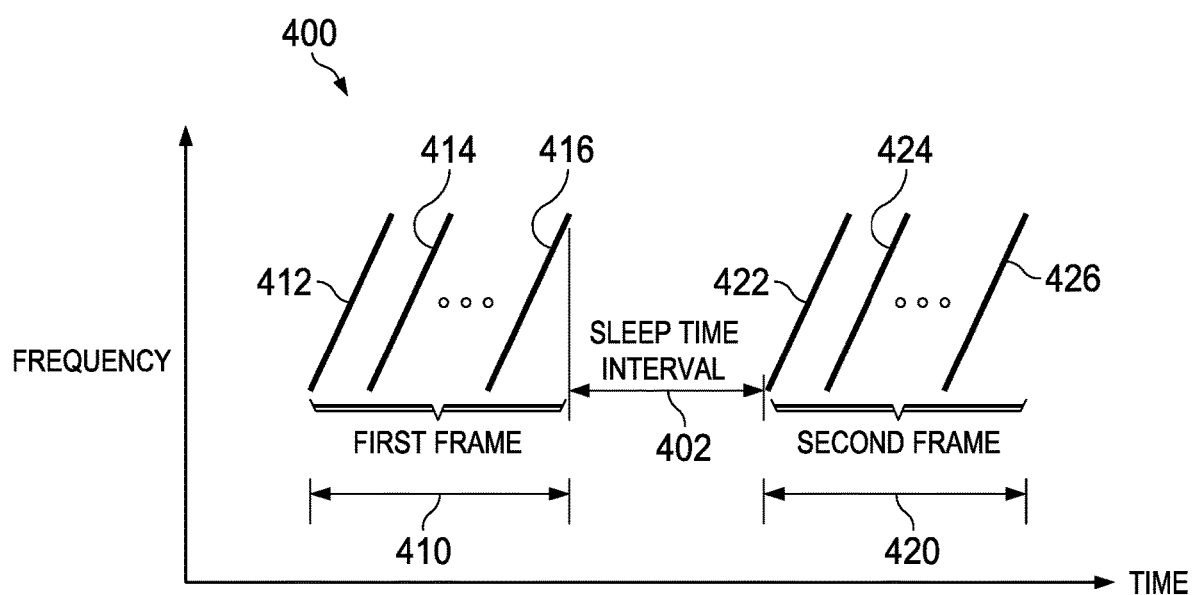
FIG. 4 is a graph showing example transmit frames with chirp signals separated by a shorter second mode sleep time interval in a second operating mode of the radar system of FIG. 1.

In the second mode 210, at 212, second mode chirp signals are transmitted in second mode frames with a second mode sleep time interval between the second mode frames. In one example, the second mode sleep time interval is shorter than the first mode sleep time interval; advantageously, this allows for power savings during the first mode and additional data during the second mode. The shorter sleep interval in the second mode also allows for a higher update rate for the range data, velocity data and angle data that is computed at 216, 218 and 220. In another example, a frame duration of the second mode chirp signals is longer than a frame duration of the first mode chirp signals, as seen in FIGS. 3 and 4 below. This feature advantageously facilitates power savings during the first mode 201 and allows for additional data during the second mode 210. The larger frame duration also allows for higher fidelity in the range. At 214, the second mode receive signal is received and converted to second mode receive data with the A/D converters 129-1, . . . 129-N. At 216, a first FFT is performed on receive data (e.g., receive data 150 in the memory 104 of FIG. 1) of the second mode to generate range data (e.g., range data 162) of the object. At 218, the processor 102 performs a second FFT on the range data (162) to generate velocity data (164) of the object. At 220, the processor 102 performs a third FFT on the velocity data (164) to generate angle data (166) of the object(s). At 222, the processor 102 determines whether an object is present within the threshold range using the range data 162. If so (YES at 222), the processor 102 remains in the second mode and returns to 212. If not (NO at 222), the system transitions to the first mode 201 and returns to 202. In some implementations, the processor 102 transitions from the second mode to the first mode (e.g., returns to 202) when the object is no longer in the threshold range over a continuous period of M consecutive frames, where N is greater than 1. This continuous period of M consecutive frames is sometimes referred to as a "blackout period."

In certain implementations, the processor 102 operates in the first mode to detect the presence of an object, and the first mode is referred to herein as a "detect only" mode. In certain examples, the first mode includes operation on receive data from one or more receive antennas to determine range and possibly velocity data for one or more identified objects in order to determine whether it is desirable in a given application to initiate operation in the second mode. For instance, the processor 102 in one example determines whether any objects are detected, and if so, whether a detected object is within a threshold range. If so, the processor 102 in one example transitions to the second mode. In another possible implementation, the processor 102 also assesses detected object velocity in the first mode, and selectively transitions to the second mode if an object is detected within a threshold range and/or if a detected object is traveling at or above a threshold velocity according to the computed velocity data. In certain implementations, the processor 102 selectively refrains from determining or computing angle data in the first mode, although not a strict requirement of all possible implementations. In other examples, the processor 102 determines range, velocity and angle data (e.g., using the data from an array of two or more receive antennas 108) in the first mode, and selectively transitions from the first mode to the second mode based on one or more criteria evaluated according to the range, velocity and/or angle data. In certain implementations, the first mode advantageously involves lower power consumption than operation in the second mode. In certain examples, this is accomplished using shorter frames and/or longer sleep time interval settings between frames in the first mode compared to the frame length and sleep time interval values used in the second mode. Additionally, in certain examples, in the first mode the LNA operates with lower noise figure compared to the noise figure in the second mode. The processor 102 in one example stores frame duration, sleep time interval values and other operating parameters for each mode in the mode data 140 of the memory 104.

An advantage of disclosed examples is savings in power consumption. In the first mode, the device consumes significantly less power with a tradeoff of only being able to detect the presence of objects. In the second mode, the device consumes more power, but is able to estimate the range, velocity, angle of objects, and perform higher layer tasks such as object classification. Detection of an object in the first mode triggers a change to the second mode.

In certain examples, moreover, the processor 102 uses selective gain adjustment to implement mode-specific tradeoff between noise figure and linearity. In the first mode, the noise-figure (NF) of the LNA 124-1, . . . 124-N determines the transmit time of the radar. A better (i.e., lower) NF translates to a shorter transmit time for the same detection sensitivity, and a 3 dB improvement in noise figure reduces analog power consumption to half in one example. Because object parameter estimation and classification are not generally done in the first mode, LNA linearity is of lesser importance. Accordingly, the first mode uses a mode-specific gain setting of the LNA 124 with low NF. The operation of an LNA has an inherent trade-off between linearity and noise figure, where the low NF is at the expense of increased non-linearity. However, since accurate estimation of the range, velocity and angle of objects is not important in the first mode, the increased non-linearity is not an issue. In contrast, the second mode of operation uses a mode of the LNA with improved linearity and degraded NF, for example, by changing the LNA amplifier gain. The degraded NF indicates an increase in transmit time, but is of minimal impact because the system 100 is expected to spend most of its time in the first mode for a wide range of applications where detection of objects in a predetermined range is temporally sparse. In addition, a better linearity translates to better spur performance (spurs result in spurious objects in the intermediate frequency (IF) spectrum). For example, spurious energy in received radar data results from non-ideal component and circuit behavior. This could be due to I/Q imbalance, nonlinear component behavior, additive interference (e.g., cross-talk), and so forth. The better linearity in the second mode ensures reliable detection of objects (with no spurious detections), whereas the gain adjustment in the first mode sacrifices linearity for improved noise figure. Linearity of an amplifier is typically measured in terms of "1 dB compression point", with a larger value for the 1 dB compression point, indicating a better linearity.

Referring also to FIGS. 3 and 4, the first mode sleep time interval between first mode frames is larger than the sleep mode time interval between frames of the second mode in one example. A longer sleep time interval in the first mode facilitates reduced power consumption compared with operation in the second mode. FIG. 3 provides a graph 300 that shows two example frames having frame durations 310 and 320 and a first sleep time interval 302 between the illustrated frames during operation in the first mode. FIG. 4 provides a graph 400 that shows two example frames having durations 410 and 420 and a shorter sleep time interval 402 between the successive frames during operation in the second mode. In this example, the first frame durations 310 and 320 are approximately same as the second frame durations 410 and 420 of FIG. 4, although not a strict requirement of all possible implementations. In this example, moreover, the first sleep time interval 302 in FIG. 3 is longer than the second sleep time interval 402 of the second mode shown in FIG. 4. The graph 300 in FIG. 3 shows three example chirp signals 312, 314, 316 in the first frame, and the second frame in FIG. 3 includes three example chirp signals 322, 324 and 326, with the first sleep time interval 302 separating the first frame and second frames in the first mode. The graph 400 in FIG. 4 shows a first frame having a frame duration 410 and including three example chirp signals 412, 414 and 416, and the illustrated second frame includes three example chirp signals 422, 424 and 426, with a second sleep time interval 402 separating the first and second frames. As shown in FIGS. 3 and 4, the first sleep time interval 302 is longer than the sleep time interval 402, and the system consumes less power in the first mode.

In one example, the processor 102 controls operation of the frame and chirp timing circuit 112 to cause the transmitter circuit 110 to transmit frames that include multiple chirp signals transmitted for a frame duration, with a controlled sleep time interval between successive frames. The processor 102 changes one or both of the frame duration and/or the sleep time interval when transitioning between the first and second operating modes. As used herein, the frame duration is the amount of time during which chirp signals are transmitted by the transmitter circuit 110, and the sleep time interval is the amount of time in between successive frames. The combination of the frame duration and the sleep time interval results in a duty cycle defined by the frame duration divided by the sum of the frame duration and the sleep time interval for each cycle of the transmitter operation. In general, the duty cycle in the first mode is less than the duty cycle in the second mode. This facilitates reduced power consumption in the first mode compared to the second mode. In certain examples, the duty cycle in the first mode is much lower than in the second mode. For example, the first mode duty cycle in one implementation uses a fixed frame duration and modifies the sleep time interval between the first and second modes. This example effectively changes a cycle frequency (e.g., the duty cycle frequency). In one possible implementation, the cycle frequency in the first mode is a few Hz, such as 1-4 Hz, and the second mode operation provides a significantly higher cycle frequency such as 40-60 Hz (e.g., 50 Hz). In this example, 50 Hz cycle frequency is set such that a host system can identify and track one or more objects of interest for a given end-use application, while the much lower cycle frequency allows effective safety determination of whether any objects of interest are within a given range of the host system. In various examples, the adjustment of the frame duration and/or the sleep time interval between successive frames allows tailoring of the duty cycle and/or cycle frequency in order to consume less power in the first mode than in the second mode. This offers various benefits, for example, in battery-operated systems, where the higher power consumption of the second mode is selectively used only when necessary, and the low-power first mode operation facilitates determination of whether the higher power consumption second mode is desired for a given end-use applications. In another example, for applications that involve tracking faster moving objects, the duty cycle of the first and/or second modes can be higher than in applications that track slower moving objects. In yet another example, for applications that track objects at a greater distance, the duty cycle of the first and/or second modes can be lower than in applications that track objects at a shorter distance. In yet another example, the sleep time interval can be adapted or changed in one or both of the first and second modes based on the range data 162 and/or velocity data 164. For example, the sleep time interval in the first and/or second mode can be decreased based on an indication from the range data 162 and/or velocity data 164 that an identified object is moving closer to the transmit antenna array 106.

The processor 102 in certain examples also provides different computational operation in the first and second modes. In other examples, the processor 102 performs the same computations in the first and second modes. In one example in the first mode, the processor 102 performs only a first FFT to generate the range data, and refrains from performing a second or subsequent FFT to generate velocity or angle data. In other embodiments, in the first mode, a first FFT to generate the range data is performed and a second FFT to generate velocity data is also performed. In the embodiments where, in the first mode, a second FFT to generate velocity data is not performed, additional power savings results because of the fewer calculations that are done.

The systems and methods described herein have applications in the automotive market. For example, the systems described herein may advantageously result in power savings in automotive radar systems. The systems and methods described herein have additional useful applications beyond the automotive market, including: automated street lighting, automatic door openers, obstacle avoidance in drones, intrusion detection, Gesture recognition in mobile phones, and so forth. Low power is advantageous in many of these applications. The systems and methods described herein result in power reduction in the above contexts.

It should be noted that many of the above-mentioned applications are temporally sparse. For example, automatic door opener will be engaged only a fraction of the time (e.g., when a vehicle is approaching). Likewise, the time during which a gesture will be performed will be a small fraction of a time that mobile device is on. In another example, when drones fly over sub-urban areas, the occurrence of obstacles will also likely to be a small portion of the time that a drone in in flight.

Additionally regarding power savings, the duty cycling is adaptive based on application in certain implementations. For example, in a drone radar system application, the duty cycle can be made dependent on the range and/or velocity of detected objects. In one implementation, the sleep time interval 302, 402 and/or frame duration 310, 320, 410, 420 is adapted based on the range and/or velocity of objects detected in the previous frame. In certain implementations, the processor 102 computes a ratio of the range to velocity of objects detected in the previous frame, and determines a minimum of these ratios. In some examples, the processor 102 sets the sleep time interval 302, 402 proportional to the minimum ratio.

For certain applications, significant power savings can be achieved in the radar system 100. For example, for battery powered host systems using the system 100 with a 3 dB NF difference between two LNA mode-specific gain settings, the use of the lower NF mode in the detect-only mode can potentially double battery life.

The illustrated methods may be implemented in hardware, processor-executed software or processor-executed firmware, programmable logic, etc., or combinations thereof, and various embodiments or implementations include non-transitory computer readable mediums having computer-executable instructions for performing the illustrated and described methods. For example, an electronic memory can be used to store computer executable instructions that are executed by a processor 102 or more than one processor to implement the method of FIG. 2.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A radar system, comprising:
an electronic memory;
a transmitter circuit configured to deliver a plurality of transmit frames individually including a plurality of chirps to a transmit antenna array including one or more transmit antennas;
a receiver circuit configured to receive signals from a receive antenna array including one or more receive antennas;
an analog-to-digital (A/D) converter configured to generate receive data based at least partially on the receive signals, the receive data including a plurality of receive frames individually associated with a corresponding one of the transmit frames; and
a processor coupled to the memory, the processor configured to:
in a first mode:
control the transmitter circuit to deliver a plurality of first mode transmit frames to the transmit antenna array, the first mode transmit frames individually having a first mode frame duration and including first mode chirp signals, the first mode transmit frames temporally spaced from one another by a first mode sleep time interval;
generate first mode range data based on receive data frames corresponding to the first mode transmit frames; and
transition to a second mode in response to detection of an object within a threshold range based on the range data; and
in the second mode:
control the transmitter circuit to deliver a plurality of second mode transmit frames to the transmit antenna array, the second mode transmit frames individually having a second mode frame duration and including second mode chirp signals, the second mode transmit frames temporally spaced from one another by a second mode sleep time interval;
wherein at least one of the first mode sleep time interval is longer than the second mode sleep time interval or the first mode frame duration is shorter than the second mode frame duration is true.

2. The radar system of claim 1, wherein the first mode sleep time interval is longer than the second mode sleep time interval.

3. The radar system of claim 1, wherein the first mode frame duration is shorter than the second mode frame duration.

4. The radar system of claim 1, wherein the processor is further configured, in the second mode, to transition to the first mode when the object is no longer within the threshold range.

5. The radar system of claim 1, wherein the processor is further configured to:
in the first mode, perform a first fast Fourier transform (FFT) on the receive data associated with the first mode chirp signals to generate the first mode range data; and
in the second mode, perform a first FFT on the receive data associated with the second mode chirp signals to generate second mode range data, and perform a second FFT on the second mode range data to generate second mode velocity data.

6. The radar system of claim 5, wherein the processor is further configured, in the second mode, to perform a third FFT on the second mode velocity data to generate second mode angle data.

7. The radar system of claim 5, wherein the processor is further configured, in the first mode, to perform a second FFT on the first mode range data to generate first mode velocity data.

8. The radar system of claim 1, wherein the processor is further configured to change the first or second mode sleep time interval based on the range data.

9. The radar system of claim 1, wherein the processor is further configured, in the second mode, to decrease the second mode sleep time interval based on an indication from the range data and velocity data that the object is moving closer to the transmit antenna array.

10. The radar system of claim 1, wherein the receiver circuit includes an amplifier with an input coupled with the receive antenna array to receive the receive signals, and an output to provide an amplified receive signal according to an adjustable amplifier gain, and wherein the processor is further configured to set the adjustable amplifier gain to a first gain in the first mode to cause the amplifier to operate with a first noise figure, and to set the adjustable amplifier gain to a lower second gain in the second mode to cause the amplifier to operate with a second noise figure, the second noise figure being higher than the first noise figure.

11. The radar system of claim 10, where a linearity of the amplifier in the second mode is better than the linearity of the amplifier in the first mode.

12. The radar system of claim 1, wherein the processor is further configured to, in the second mode, transition to the first mode when the object is no longer within the threshold range for an integer number M or more consecutive frames, M being greater than 1.

13. A method for processing radar signals in a radar system, the method comprising:
 in a first mode:
  delivering a plurality of first mode transmit frames to the transmit antenna array, the first mode transmit frames individually having a first mode frame duration and including first mode chirp signals, the first mode transmit frames temporally spaced from one another by a first mode sleep time interval;
  performing a first fast Fourier transform (FFT) on receive data of the first mode to generate first mode range data of an object based on receive data frames corresponding to the first mode transmit frames, and to determine that the object is present within a threshold range; and
 in response to determining that the object is present within the threshold range, transitioning to a second mode; and
 in the second mode:
  delivering a plurality of second mode transmit frames to the receive antenna array, the second mode transmit frames individually having a second mode frame duration and including second mode chirp signals, the second mode transmit frames temporally spaced from one another by a second mode sleep time interval;
  performing a first FFT on receive data of the second mode to generate second mode range data of the object; and
  performing a second FFT on the second mode range data to generate second mode velocity data of the object;
 wherein at least one of the first mode sleep time interval is longer than the second mode sleep time interval between the second mode transmit frames or the first mode frame duration is shorter than the second mode frame duration is true.

14. The method according to claim 13, further comprising, in the second mode, performing a third FFT on the second mode velocity data to generate second mode angle data.

15. The method of claim 13, further comprising, in the first mode, performing a second FFT on the second mode range data to generate velocity data.

16. The method of claim 13, further comprising, in the second mode, transitioning to the first mode when the object is not present within the threshold range.

* * * * *